(12) United States Patent
Hiraoka

(10) Patent No.: US 12,483,026 B2
(45) Date of Patent: Nov. 25, 2025

(54) ELECTROSTATIC PROTECTION CIRCUIT

(71) Applicants: Kabushiki Kaisha Toshiba, Tokyo (JP); Toshiba Electronic Devices & Storage Corporation, Tokyo (JP)

(72) Inventor: Takayuki Hiraoka, Kawasaki Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 174 days.

(21) Appl. No.: 18/237,319

(22) Filed: Aug. 23, 2023

(65) Prior Publication Data

US 2024/0332957 A1  Oct. 3, 2024

(30) Foreign Application Priority Data

Mar. 27, 2023 (JP) .................. 2023-049564

(51) Int. Cl.
*H02H 9/04* (2006.01)

(52) U.S. Cl.
CPC .................. *H02H 9/044* (2013.01)

(58) Field of Classification Search
CPC ........ H02H 9/044; H02H 9/046; H02H 9/025; H10D 89/611; H10D 89/60; H01L 2924/00
USPC .......................................................... 361/56
See application file for complete search history.

(56) References Cited

U.S. PATENT DOCUMENTS

| | | | | |
|---|---|---|---|---|
| 5,889,644 | A * | 3/1999 | Schoenfeld ......... | H10D 89/611 361/111 |
| 5,978,192 | A * | 11/1999 | Young .................... | H02H 9/046 361/111 |
| 6,064,249 | A * | 5/2000 | Duvvury .............. | H10D 89/814 327/330 |
| 6,385,028 | B1 * | 5/2002 | Kouno ............ | H03K 17/08122 361/111 |
| 6,614,633 | B1 * | 9/2003 | Kohno ............... | H03K 17/0822 361/111 |
| 8,559,144 | B2 * | 10/2013 | Vashchenko ........... | H02H 9/046 361/56 |
| 10,367,350 | B2 * | 7/2019 | Glaser .................... | H02H 9/046 |
| 11,837,866 | B1 * | 12/2023 | Fang ...................... | H02H 9/046 |

(Continued)

FOREIGN PATENT DOCUMENTS

| CN | 215185854 U | * 12/2021 | |
|---|---|---|---|
| CN | 118889351 A | * 11/2024 | ............... H02H 7/20 |

(Continued)

*Primary Examiner* — Dharti H Patel
(74) *Attorney, Agent, or Firm* — Kim & Stewart LLP

(57) ABSTRACT

According to one embodiment, an electrostatic protection circuit includes first, second and third diodes, a resistance element, and a MOS field-effect transistor. The first diode is coupled to a first wiring. The second diode is coupled between the first diode and a second wiring. The third diode is coupled between the first wiring and a first node at which the first diode and the second diode are coupled to each other. The resistance element is coupled between the third diode and the first wiring. The MOS field-effect transistor is coupled between the first node and the first wiring. A gate of the MOS field-effect transistor is electrically coupled to a second node at which the resistance element and the third diode are coupled to each other.

18 Claims, 6 Drawing Sheets

(56) References Cited

U.S. PATENT DOCUMENTS

| | | | | |
|---|---|---|---|---|
| 12,119,640 | B2 * | 10/2024 | Gao | H10D 89/611 |
| 12,244,137 | B2 * | 3/2025 | Russ | H01L 23/60 |
| 2004/0240127 | A1 * | 12/2004 | Juliano | H10D 12/211 |
| | | | | 257/E29.195 |
| 2010/0220419 | A1 * | 9/2010 | Krabbenborg | H10D 89/819 |
| | | | | 361/56 |
| 2010/0302693 | A1 * | 12/2010 | Hayashi | H10D 89/601 |
| | | | | 361/56 |
| 2011/0255201 | A1 * | 10/2011 | Shimomura | H02H 9/046 |
| | | | | 361/56 |
| 2011/0304940 | A1 * | 12/2011 | Cao | H01L 23/60 |
| | | | | 361/56 |
| 2012/0212869 | A1 * | 8/2012 | Shimomura | H02H 9/046 |
| | | | | 361/56 |
| 2012/0307532 | A1 * | 12/2012 | Godo | H10D 88/00 |
| | | | | 363/37 |
| 2013/0335868 | A1 * | 12/2013 | Lamar | H02H 9/046 |
| | | | | 361/56 |
| 2014/0078624 | A1 | 3/2014 | Nagamatsu et al. | |
| 2014/0233139 | A1 * | 8/2014 | Kang | H02H 9/043 |
| | | | | 361/56 |
| 2015/0214731 | A1 * | 7/2015 | Tsurui | H02H 9/046 |
| | | | | 327/109 |
| 2016/0126235 | A1 * | 5/2016 | Nishimura | H10D 89/611 |
| | | | | 257/296 |
| 2018/0006448 | A1 * | 1/2018 | Glaser | H02H 9/046 |
| 2019/0237967 | A1 * | 8/2019 | Knoedgen | H10D 89/611 |
| 2020/0258880 | A1 * | 8/2020 | Takahashi | H10D 89/611 |
| 2022/0320856 | A1 * | 10/2022 | Sakai | H02H 9/046 |
| 2024/0178830 | A1 * | 5/2024 | Leong | H10D 89/611 |
| 2024/0372356 | A1 * | 11/2024 | Mysore Rajagopal | |
| | | | | H05K 9/0067 |
| 2024/0372359 | A1 * | 11/2024 | Heurtier | H10D 89/611 |

FOREIGN PATENT DOCUMENTS

| | | | | |
|---|---|---|---|---|
| EP | 2256806 | A2 * | 12/2010 | H10D 12/411 |
| JP | H10512718 | A * | 12/1998 | H01L 27/0255 |
| JP | 2012133924 | A * | 7/2012 | |
| JP | 2014-063854 | A | 4/2014 | |
| JP | 2014-075435 | A | 4/2014 | |
| JP | 2014-120547 | A | 6/2014 | |
| KR | 100898583 | B1 * | 5/2009 | H10D 84/00 |
| KR | 101016951 | B1 * | 2/2011 | H02H 9/046 |
| WO | WO-2008155729 | A1 * | 12/2008 | H10D 89/819 |

* cited by examiner

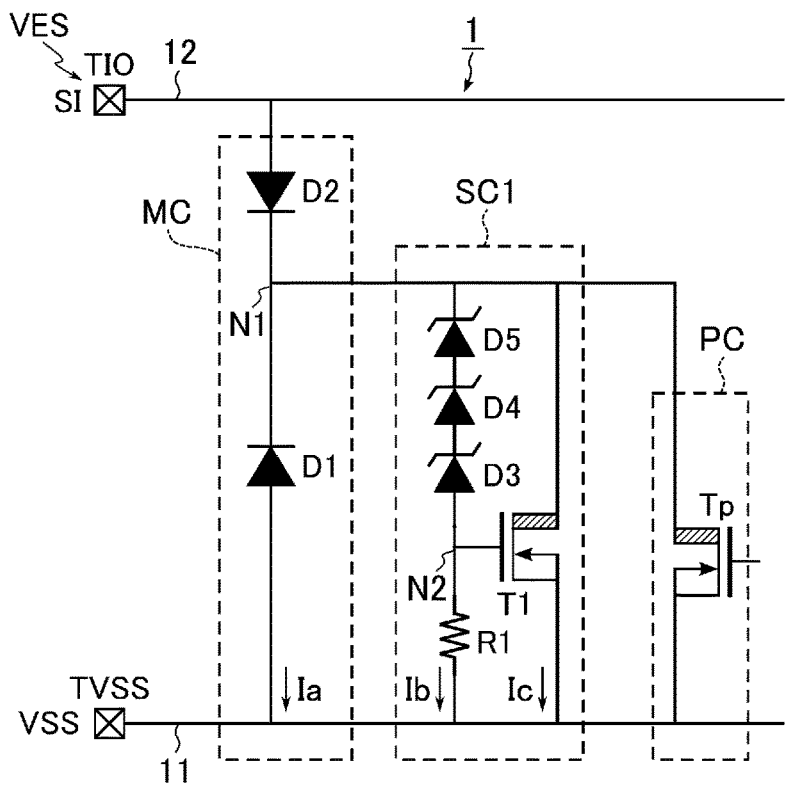
F I G. 1
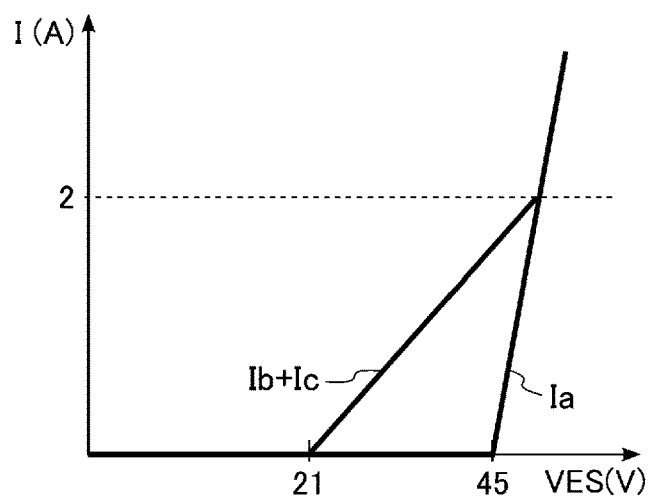
F I G. 2

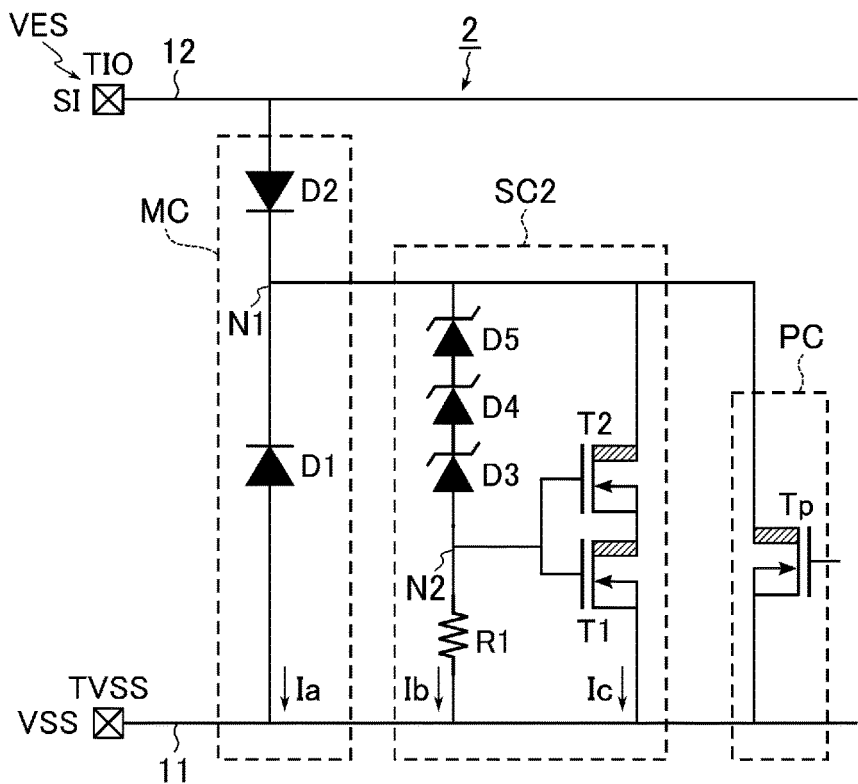
F I G. 3
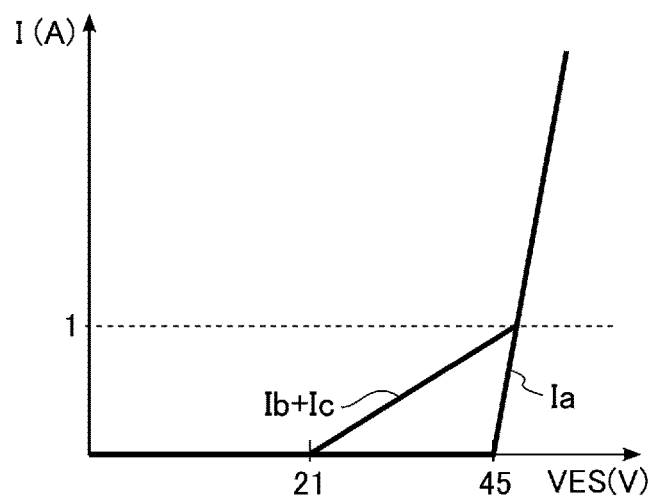
F I G. 4

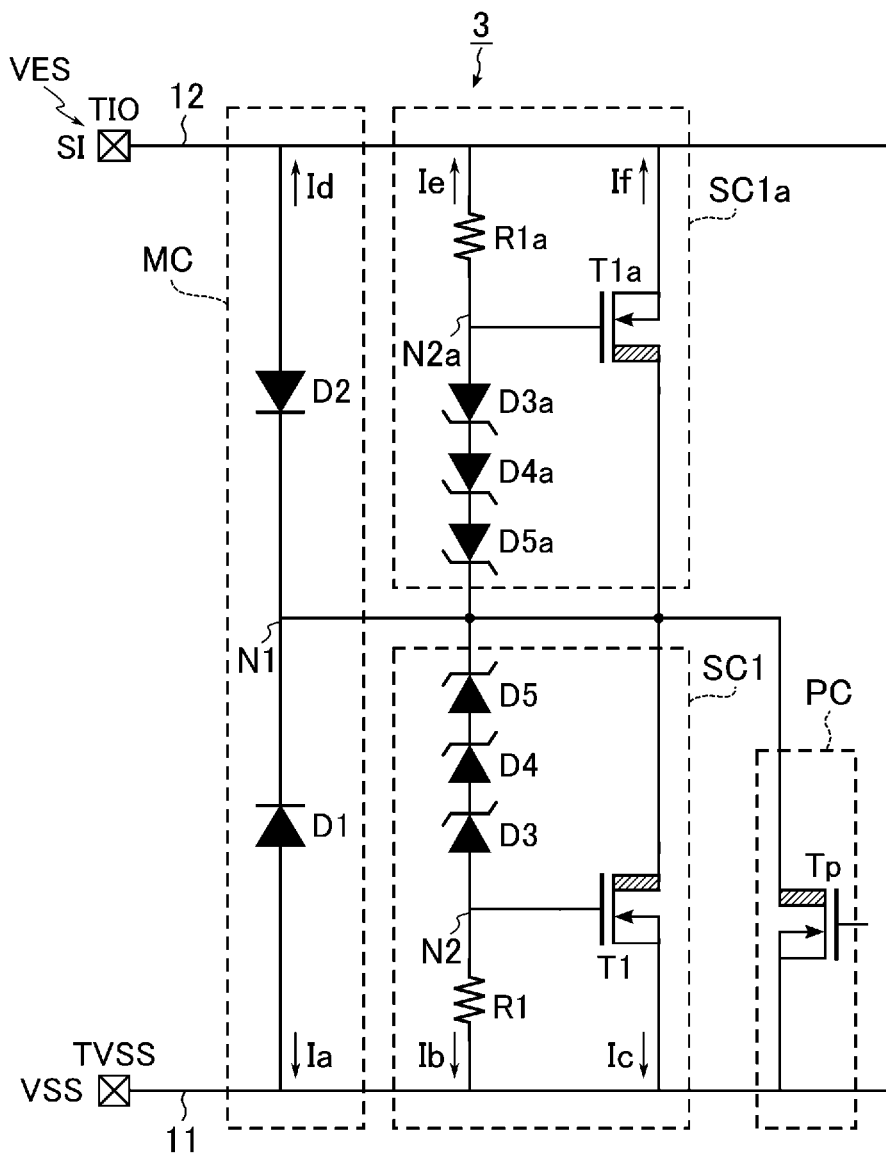
F I G. 5

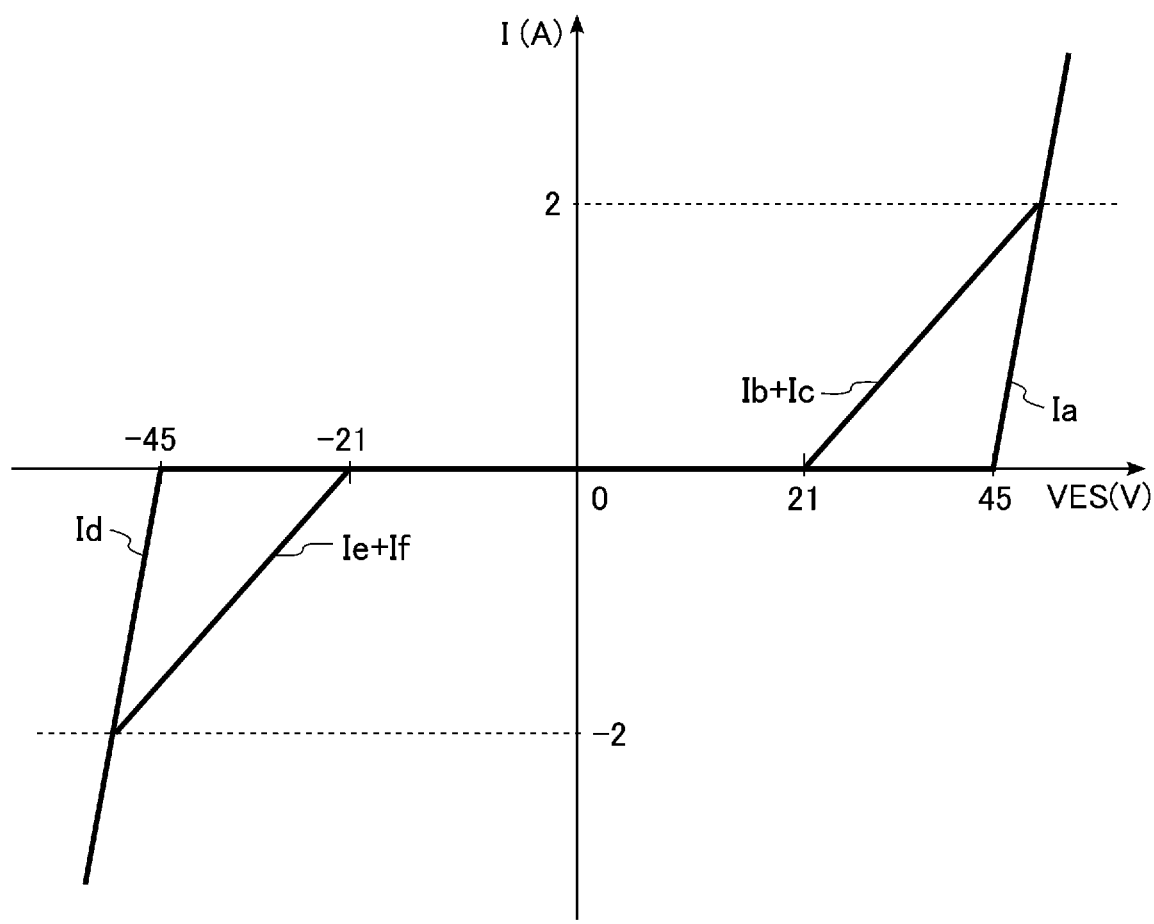
F I G. 6

ELECTROSTATIC PROTECTION CIRCUIT

CROSS-REFERENCE TO RELATED APPLICATIONS

This application is based upon and claims the benefit of priority from Japanese Patent Application No. 2023-049564, filed Mar. 27, 2023, the entire contents of which are incorporated herein by reference.

FIELD

Embodiments described herein relate generally to an electrostatic protection circuit.

BACKGROUND

An electromagnetic susceptibility (EMS) countermeasure protection circuit that protects inner circuits from an electrostatic discharge (ESD) and a surge voltage (or surge current) due to opening/closing of a circuit (hereinafter, an "electrostatic protection circuit") is known.

BRIEF DESCRIPTION OF THE DRAWINGS

FIG. 1 is a circuit diagram showing a configuration of an electrostatic protection circuit according to a first embodiment.

FIG. 2 is a diagram showing current-voltage characteristics of the electrostatic protection circuit according to the first embodiment.

FIG. 3 is a circuit diagram showing a configuration of an electrostatic protection circuit according to a second embodiment.

FIG. 4 is a diagram showing current-voltage characteristics of the electrostatic protection circuit according to the second embodiment.

FIG. 5 is a circuit diagram showing a configuration of an electrostatic protection circuit according to a third embodiment.

FIG. 6 is a diagram showing current-voltage characteristics of the electrostatic protection circuit according to the third embodiment.

DETAILED DESCRIPTION

Figure 7:
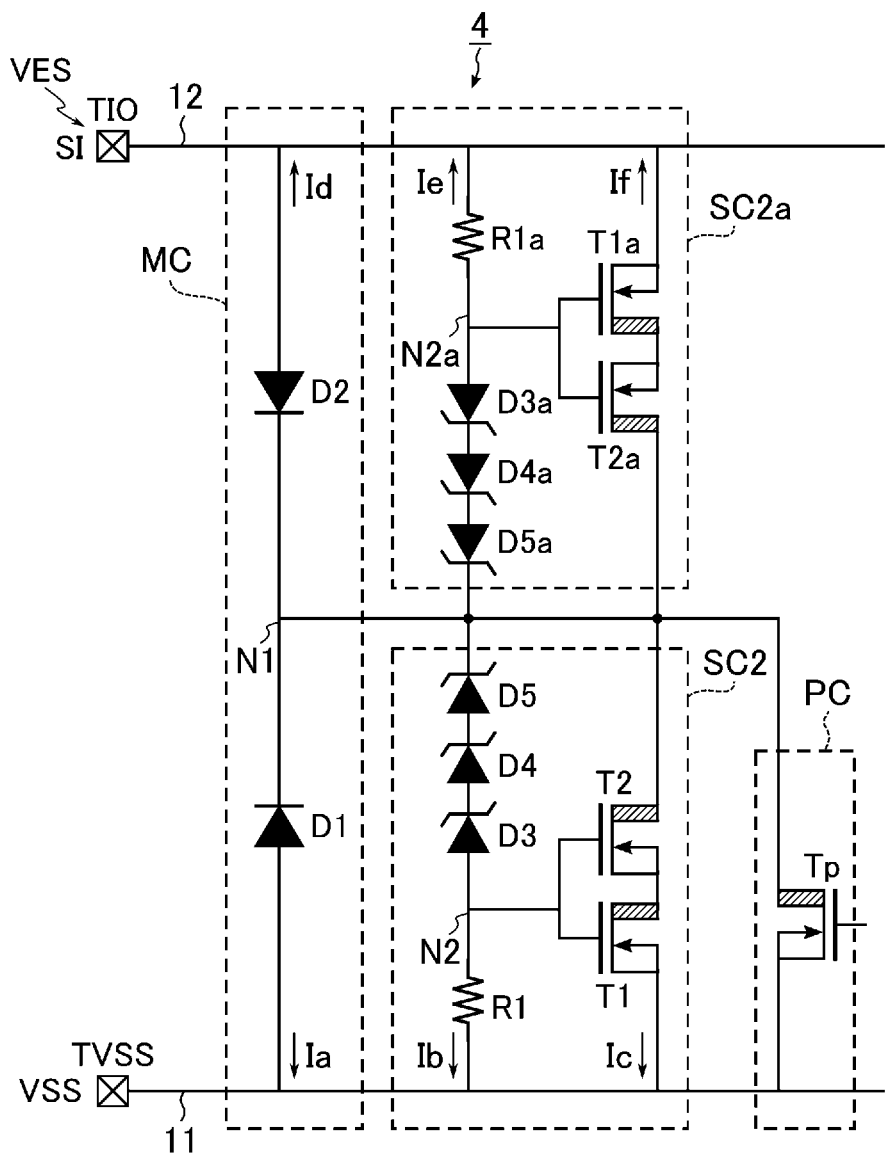
FIG. 7 is a circuit diagram showing a configuration of an electrostatic protection circuit according to a fourth embodiment.

In general, according to one embodiment, an electrostatic protection circuit includes a first diode coupled to a first wiring; a second diode coupled between the first diode and a second wiring; a third diode coupled between the first wiring and a first node at which the first diode and the second diode are coupled to each other; a first resistance element coupled between the third diode and the first wiring; and a first MOS field-effect transistor coupled between the first node and the first wiring, a gate of the first MOS field-effect transistor being electrically coupled to a second node at which the first resistance element and the third diode are coupled to each other.

Hereinafter, embodiments will be described with reference to the drawings. In the descriptions below, constituent elements having the same functions and configurations will be denoted by the same reference symbols. Each of the following embodiments is shown to present an example of a device and a method for carrying out the technical concept of the embodiment, and it is to be understood that the materials, the shapes, the structures, the arrangements, and the like of the constituent components are not limited to those shown below.

1. First Embodiment

An electrostatic protection circuit of the first embodiment is described. An electrostatic protection circuit is a circuit that protects a protection-target circuit from an electrostatic discharge (ESD) that enters from an input/output terminal or a surge voltage (or surge current) due to opening/closing of a circuit. The electrostatic protection circuit prevents a protection-target circuit from being destroyed when an excessive current flows in the protection-target circuit by letting a current caused by a surge voltage escape to a ground terminal.

1.1 Configuration of First Embodiment

FIG. 1 is a circuit diagram showing a configuration of the electrostatic protection circuit of the first embodiment.

The electrostatic protection circuit 1 includes a main clamping circuit MC and a subclamping circuit SC1 provided between a ground terminal TVSS and an input/output terminal TIO. Furthermore, a protection-target circuit PC protected by the electrostatic protection circuit 1 is provided between the ground terminal TVSS and the input/output terminal TIO. A voltage VSS of a low-level side, for example a ground voltage (e.g., 0 V), is supplied to the ground terminal TVSS from the outside of the circuit. An input/output signal SI of a high-level side is input and output between the input/output terminal TIO and the outside of the circuit.

The main clamping circuit MC is a main protective circuit, and a subclamping circuit SC1 is a secondary protective circuit. The main clamping circuit MC includes a diode D1 and a diode D2. The subclamping circuit SC1 includes Zener diodes D3, D4, and D5, a resistance element R1, and a MOS field-effect transistor (for example, an n-channel double-diffused metal oxide semiconductor (DMOS) field-effect transistor) T1. As a protection-target circuit PC, a MOS field-effect transistor (for example, an n-channel DMOS field-effect transistor) Tp is provided.

Each of the diodes D1 and D2 in the main clamping circuit MC includes, for example, a transient voltage suppressor (TVS) diode, which is a type of a Zener diode. The diodes D1 and D2 protect a protection-target circuit PC from a surge voltage that enters from the input/output terminal TIO such as ESD, or prevent an erroneous operation of the protection-target circuit PC caused by a surge voltage.

The Zener diodes D3, D4, and D5 in the subclamping circuit SC1 set a voltage supplied to a gate of the MOS transistor T1 to a constant level when there is a surge voltage caused by an ESD, etc., and turn on the MOS transistor T1. The MOS transistor T1 is turned on upon occurrence of a surge voltage to let a large current caused by the surge voltage escape to the ground terminal TVSS. The resistance element R1 suppresses flowing of a large current in the Zener diodes D3, D4, and D5, and prevents the Zener diodes D3, D4, and D5 from being destroyed.

Hereinafter, a relationship of couplings between the circuits shown in FIG. 1 is explained. A ground wiring 11 is coupled to the ground terminal TVSS. A signal wiring 12 is coupled to the input/output terminal TIO. The diodes D1 and D2 are coupled between the ground wiring 11 and the signal wiring 12. The diodes D1 and D2 are coupled in series in such a manner that their cathodes face each other. In other words, the anode of the diode D1 is coupled to the ground wiring 11, and the cathode of the diode D1 is coupled to the cathode of the diode D2. The anode of the diode D2 is coupled to the signal wiring 12. Hereinafter, a node at which the cathode of diode D1 and the cathode of the diode D2 are coupled to each other is referred to as a "first node N1".

The resistance element R1 and the Zener diodes D3, D4, and D5 are coupled between the ground wiring 11 and the first node N1. The resistance element R1 and the Zener diodes D3, D4, and D5 are coupled in series. In other words, one end of the resistance element R1 is coupled to the ground wiring 11, and the other end of the resistance element R1 is coupled to the anode of the Zener diode D3. The cathode of the Zener diode D3 is coupled to the anode of the Zener diode D4, and the cathode of the Zener diode D4 is coupled to the anode of the Zener diode D5. Furthermore, the cathode of the Zener diode D5 is coupled to the first node N1. Hereinafter, the node at which the other end of the resistance element R1 and the anode of the Zener diode D3 are coupled to each other will be referred to as a "second node N2".

The MOS transistor T1 couples the ground wiring 11 to the first node N1. In other words, the source of the MOS transistor T1 is coupled to the ground wiring 11, and the drain of the MOS transistor T1 is coupled to the first node N1. The gate of the MOS transistor T1 is coupled to the second node N2.

The MOS transistor Tp as a protection-target circuit PC couples the ground wiring 11 to the first node N1. In other words, the source of the MOS transistor Tp is coupled to the ground wiring 11, and the drain of the MOS transistor Tp is coupled to the first node N1.

In the present embodiment, the serially coupled, three-stage Zener diodes D3, D4, and D5 are provided between the ground wiring 11 and the first node N1; however, the embodiment is not limited to this example. The number of stages of the Zener diodes provided between the ground wiring 11 and the first node N1 can be discretionarily set. The number of stages of the Zener diodes is set based on a turn-on voltage of the MOS transistor T1 in the subclamping circuit SC1 and the specification of the electrostatic protection circuit 1.

1.2. Operation of First Embodiment

An operation of the electrostatic protection circuit 1 of the first embodiment is described hereinafter.

FIG. 2 is a diagram showing current-voltage characteristics of the electrostatic protection circuit according to the first embodiment. The horizontal axis represents a voltage VES that is input to the input/output terminal TIO, and the vertical axis represents a current I that flows in the main clamping circuit MC and the subclamping circuit SC1. The voltage VES is, for example, a surge voltage that is caused by an ESD, etc. and enters from the outside of the circuit. Suppose the current flowing in the main clamping circuit MC is Ia, the current flowing in the resistance element R1 of the subclamping circuit SC1 is Ib, and the current flowing in a current path of the MOS transistor T1 is Ic. Herein, as an example, the case in which a withstand voltage of each of the diodes D1 and D2 is 45 V, a breakdown voltage of the serially coupled, three-stage Zener diodes D3, D4, and D5 is 21 V, and a resistance value of the resistance element R1 is 100 kΩ is described. A breakdown voltage of each of the Zener diodes D3, D4, and D5 is 7 V.

As shown in FIG. 2, until the voltage VES that is input to the input/output terminal TIO reaches 21 V, no current flows in the main clamping circuit MC and the subclamping circuit SC1.

Next, when the voltage VES exceeds 21 V, the current (Ib+Ic) starts flowing in the subclamping circuit SC1, and the current (Ib+Ic) increases as the voltage VES increases.

Next, when the voltage VES exceeds 45 V, the current Ia starts flowing in the main clamping circuit MC. Thereafter, the current (Ia+Ib+Ic) increases to the order of 2A or larger, for example.

In the electrostatic protection circuit 1 of the first embodiment, a large current caused by the voltage VES is allowed to quickly escape to the ground terminal TVSS by the current (Ib+Ic) of the subclamping circuit SC1, when the voltage VES exceeds 21 V. It is thereby possible to prevent an excessive current from flowing in the protection-target circuit PC. As a result, it is possible to prevent the protection-target circuit PC from being destroyed by a surge voltage caused by an ESD, etc.

1.3 Effects of First Embodiment

According to the first embodiment, an electrostatic protection circuit that can improve protective performance can be provided.

Effects of the first embodiment are described in detail hereinafter. With the configuration according to the first embodiment, the ability of the subclamping circuit SC1 to discharge a surge voltage can be improved by providing the MOS transistor T1 in the subclamping circuit SC1. In other words, the ability of the subclamping circuit SC1 to process a surge current (or a peak current) and to respond quickly to a surge voltage can be improved.

According to the configuration of the first embodiment, since a junction capacity of the MOS transistor T1 ensures a discharge path to deal with a rapid surge, regardless of the number of stages of the Zener diodes, quick responsiveness can be improved compared to the case where no MOS transistor T1 is provided.

2. Second Embodiment

An electrostatic protection circuit of the second embodiment is described. The second embodiment is an example in which two MOS transistors are provided in a subclamping circuit. The explanation of the second embodiment will focus mainly on the points that differ from the first embodiment.

2.1 Configuration of Second Embodiment

FIG. 3 is a circuit diagram showing a configuration of an electrostatic protection circuit of the second embodiment.

The electrostatic protection circuit 2 includes the main clamping circuit MC and a subclamping circuit SC2 provided between the ground terminal TVSS and the input/output terminal TIO. The main clamping circuit MC includes the diode D1 and the diode D2. The subclamping circuit SC2 includes the Zener diodes D3, D4, and D5, the resistance element R1, the MOS transistor T1, and a MOS field-effect transistor (for example, an n-channel double-diffused metal oxide semiconductor (DMOS) field-effect transistor) T2.

The Zener diodes D3, D4, and D5 in the subclamping circuit SC2 set a voltage supplied to gates of the MOS transistors T1 and T2 to a constant level when a surge voltage is caused by an ESD, etc., and turn on the MOS transistors T1 and T2. The MOS transistors T1 and T2 are turned on upon occurrence of a surge voltage to let a large current caused by the surge voltage escape to the ground terminal TVSS.

Hereinafter, the coupling relationships between the circuits shown in FIG. 3 are explained. The diodes D1 and D2 are coupled between the ground wiring 11 and the signal wiring 12. The diodes D1 and D2 are coupled in series in such a manner that their cathodes face each other. In other words, the anode of the diode D1 is coupled to the ground wiring 11, and the cathode of the diode D1 is coupled to the cathode of the diode D2. The anode of the diode D2 is coupled to the signal wiring 12.

The resistance element R1 and the Zener diodes D3, D4, and D5 are coupled between the ground wiring 11 and the first node N1. The resistance element R1 and the Zener diodes D3, D4, and D5 are coupled in series. In other words, one end of the resistance element R1 is coupled to the ground wiring 11, and the other end of the resistance element R1 is coupled to the anode of the Zener diode D3. The cathode of the Zener diode D3 is coupled to the anode of the Zener diode D4, and the cathode of the Zener diode D4 is coupled to the anode of the Zener diode D5. Furthermore, the cathode of the Zener diode D5 is coupled to the first node N1.

The MOS transistors T1 and T2 couple the ground wiring 11 to the first node N1. More specifically, the MOS transistors T1 and T2 are coupled in such a manner that the current paths thereof are in series. In other words, the source of the MOS transistor T1 is coupled to the ground wiring 11, and the drain of the MOS transistor T1 is coupled to the source of the MOS transistor T2. The drain of the MOS transistor T2 is coupled to the first node N1. Furthermore, the gates of the MOS transistors T1 and T2 are coupled to the second node N2.

In the present embodiment, the two-stage MOS transistors T1 and T2 are provided between the ground wiring 11 and the first node N1; however, the embodiment is not limited to this example. The number of MOS transistors provided between the ground wiring 11 and the first node N1 can be discretionarily set; for example, three or more stages of MOS transistors may be provided.

The serially coupled, three-stage Zener diodes D3, D4, and D5 are provided between the ground wiring 11 and the first node N1; however, the embodiment is not limited to this example. The number of stages of the Zener diodes provided between the ground wiring 11 and the first node N1 can be discretionarily set.

2.2. Operation of Second Embodiment

An operation of the electrostatic protection circuit 2 of the second embodiment is described hereinafter.

FIG. 4 is a diagram showing current-voltage characteristics of the electrostatic protection circuit according to the second embodiment. The horizontal axis represents a voltage VES that is input to the input/output terminal TIO, and the vertical axis represents a current I that flows in the main clamping circuit MC and the subclamping circuit SC2. Suppose the current flowing in the main clamping circuit MC is Ia, the current flowing in the resistance element R1 of the subclamping circuit SC2 is Ib, and the current flowing in a current path of each of the MOS transistors T1 and T2 is Ic. Herein, as an example, the case in which a withstand voltage of each of the diodes D1 and D2 is 45 V, a breakdown voltage of the serially coupled, three-stage Zener diodes D3, D4, and D5 is 21 V, and the MOS transistors T1 and T2 have the same "on" resistance.

As shown in FIG. 4, until the voltage VES that is input to the input/output terminal TIO reaches 21 V, no current flows in the main clamping circuit MC and the subclamping circuit SC2.

Next, when the voltage VES exceeds 21 V, the current (Ib+Ic) starts flowing in the subclamping circuit SC2, and the current (Ib+Ic) increases as the voltage VES increases. Herein, the "on" resistance of the MOS transistors T1 and T2 is twice the "on" resistance of the MOS transistor T1 in the first embodiment. For this reason, an amount of the current (Ib+Ic) in the second embodiment becomes about ½ of an amount of the current (Ib+Ic) in the first embodiment. Even in this case, however, there are no problems, because an amount of current necessary for protecting a protection-target circuit PC can be maintained.

Next, when the voltage VES exceeds 45 V, the current Ia starts flowing in the main clamping circuit MC. Thereafter, the current (Ia+Ib+Ic) increases to the order of 1A or larger, for example.

In the electrostatic protection circuit 2 of the second embodiment, a large current caused by the voltage VES is allowed to quickly escape to the ground terminal TVSS by the current (Ib+Ic) of the subclamping circuit SC2, when the voltage VES exceeds 21 V. It is thereby possible to prevent an excessive current flowing in the protection-target circuit PC. As a result, it is possible to prevent the protection-target circuit PC from being destroyed by a surge voltage caused by an ESD, etc.

2.3 Effects of Second Embodiment

According to the second embodiment, an electrostatic protection circuit that can improve protective performance can be provided.

Effects of the second embodiment are described in detail hereinafter. With the configuration according to the second embodiment, the ability of the subclamping circuit SC2 to discharge a surge voltage can be improved by providing the MOS transistors T1 and T2 in the subclamping circuit SC2. In other words, the ability of the subclamping circuit SC2 to process a surge current (or a peak current) and respond quickly to a surge voltage can be improved.

According to the configuration of the second embodiment, since a junction capacity of the MOS transistors T1 and T2 ensures a discharge path to deal with a rapid surge regardless of the number of stages of the Zener diodes, quick responsiveness can be improved compared to the case where no MOS transistors T1 and T2 are provided.

Furthermore, with the configuration of the second embodiment, the breakdown voltages of the MOS transistor T1 and T2 in the subclamping circuit SC2 can be increased. In other words, a maximum voltage (i.e., a withstand voltage) that can be applied between the drain of the MOS transistor T2 and the source of the MOS transistor T1 can be increased. It is thereby possible to prevent unintentional breakdown of the MOS transistors T1 and T2 and prevent the MOS transistors T1 and T2 from being destroyed.

3. Third Embodiment

An electrostatic protection circuit of the third embodiment is described. The third embodiment is a configuration example applicable to the case where a positive or negative voltage VES is input to the input/output terminal TIO. In the third embodiment, an example is given in which two subclamping circuits, which are used in the first embodiment, are provided. The explanation of the third embodiment will focus mainly on the points that differ from the first embodiment.

3.1 Configuration of Third Embodiment

FIG. 5 is a circuit diagram showing a configuration of an electrostatic protection circuit of the third embodiment.

The electrostatic protection circuit 3 includes the main clamping circuit MC, the subclamping circuit SC1 and a subclamping circuit SC1a provided between the ground terminal TVSS and the input/output terminal TIO. Specifically, the subclamping circuit SC1 is provided between the ground terminal TVSS and the first node N1. The subclamping circuit SC1a is provided between the input/output terminal TIO and the first node N1.

The main clamping circuit MC includes the diode D1 and the diode D2. The subclamping circuit SC1 includes the Zener diodes D3, D4, and D5, the resistance element R1, and the MOS transistor T1. The subclamping circuit SC1a includes Zener diodes D3a, D4a, and D5a, a resistance element R1a, and a MOS field-effect transistor (for example, an n-channel double-diffused metal oxide semiconductor (DMOS) field-effect transistor) T1a.

The Zener diodes D3a, D4a, and D5a in the subclamping circuit SC1a set a voltage supplied to a gate of the MOS transistor T1a to a constant level when a surge voltage caused by an ESD, etc., occurs and turn on the MOS transistor T1a. The MOS transistor T1a is turned on upon occurrence of a surge voltage, and lets a large current caused by the surge voltage escape to the input/output terminal TIO.

Hereinafter, the coupling relationships between the circuits shown in FIG. 5 are explained. Similarly to the first embodiment, the diodes D1 and D2 are coupled between the ground wiring 11 and the signal wiring 12. The diodes D1 and D2 are coupled in series in such a manner that their cathodes face each other.

The resistance element R1 and the Zener diodes D3, D4, and D5 are coupled between the ground wiring 11 and the first node N1, similarly to the first embodiment. The resistance element R1 and the Zener diodes D3, D4, and D5 are coupled in series.

The MOS transistor T1 couples the ground wiring 11 to the first node N1, similarly to the first embodiment. The source of the MOS transistor T1 is coupled to the ground wiring 11, and the drain of the MOS transistor T1 is coupled to the first node N1. The gate of the MOS transistor T1 is coupled to the second node N2.

The resistance element R1a and the Zener diodes D3a, D4a, and D5a are coupled between the signal wiring 12 and the first node N1. The resistance element R1a and the Zener diodes D3a, D4a, and D5a are coupled in series. In other words, one end of the resistance element R1a is coupled to the signal wiring 12, and the other end of the resistance element R1a is coupled to the anode of the Zener diode D3a. The cathode of the Zener diode D3a is coupled to the anode of the Zener diode D4a, and the cathode of the Zener diode D4a is coupled to the anode of the Zener diode D5a. Furthermore, the cathode of the Zener diode D5a is coupled to the first node N1. Hereinafter, the node at which the other end of the resistance element R1a and the anode of the Zener diode D3a will be referred to as a "third node N2a".

The MOS transistor T1a couples the signal wiring 12 to the first node N1. In other words, the source of the MOS transistor T1a is coupled to the signal wiring 12, and the drain of the MOS transistor T1a is coupled to the first node N1. The gate of the MOS transistor T1a is coupled to the third node N2a.

In the present embodiment, the serially coupled, three-stage Zener diodes are provided between the ground wiring 11 and the first node N1 and between the signal wiring 12 and the first node N1, respectively; however, the embodiment is not limited to this example. The number of stages of the Zener diodes provided between the ground wiring 11 and the first node N1 and between the signal wiring 12 and the first node N1 can be discretionarily set.

3.2. Operation of Third Embodiment

An operation of the electrostatic protection circuit 3 of the third embodiment is described hereinafter.

FIG. 6 is a diagram showing current-voltage characteristics of the electrostatic protection circuit according to the third embodiment. The horizontal axis represents a voltage VES that is input to the input/output terminal TIO, and the vertical axis represents a current that flows in the main clamping circuit MC and the subclamping circuits SC1 and SC1a. Suppose the current flowing in the main clamping circuit MC is Ia or Id, the current flowing in the resistance element R1 of the subclamping circuit SC1 is Ib, and the current flowing in a current path of the MOS transistor T1 is Ic. Suppose the current flowing in the resistance element R1a of the subclamping circuit SC1a is Ie, and the current flowing in a current path of the MOS transistor T1a is If. Herein, as an example, the case in which a withstand voltage of each of the diodes D1 and D2 is 45 V and a breakdown voltage of each of the serially coupled, three-stage Zener diodes D3, D4, and D5 and three-stage Zener diodes D3a, D4a, and D5a is 21 V is described.

First, if the voltage VES that is input to the input/output terminal TIO is a positive voltage, the operation is as described below. As shown in FIG. 6, until the voltage VES that is input to the input/output terminal TIO reaches 21 V, no current flows in the main clamping circuit MC and the subclamping circuits SC1 and SC1a.

Next, when the voltage VES exceeds 21 V, the current (Ib+Ic) starts flowing in the subclamping circuit SC1, and the current (Ib+Ic) increases as the voltage VES increases.

Next, when the voltage VES exceeds 45 V, the current Ia starts flowing in the main clamping circuit MC. Thereafter, the current (Ia+Ib+Ic) increases to the order of 2A or larger, for example.

If the voltage VES that is input to the input/output terminal TIO is a negative voltage, on the other hand, the operation is as described below. Until the voltage VES that is input to the input/output terminal TIO falls to −21 V, no current flows in the main clamping circuit MC and the subclamping circuits SC1 and SC1a.

Next, when the voltage VES falls below −21 V, the current (Ie+If) starts flowing in the subclamping circuit SC1a, and the current (Ie+If) increases as the voltage VES falls.

Next, when the voltage VES falls below −45 V, the current Id starts flowing in the main clamping circuit MC. Thereafter, the current (Id+Ie+If) increases to the order of −2A or larger, for example.

In the electrostatic protection circuit 3 of the third embodiment, a large current caused by the voltage VES is allowed to quickly escape to the ground terminal TVSS by the current (Ib+Ic) of the subclamping circuit SC1, when the voltage VES exceeds 21 V. A large current caused by the voltage VES is allowed to quickly escape to the input/output terminal TIO by the current (Ie+If) of the subclamping circuit SC1a, when the voltage VES falls below −21 V. It is thereby possible to prevent an excessive current flowing in the protection-target circuit PC. As a result, it is possible to prevent the protection-target circuit PC from being destroyed by a surge voltage caused by an ESD, etc.

3.3 Effects of Third Embodiment

According to the third embodiment, an electrostatic protection circuit that can improve protective performance can be provided.

With the configuration of the third embodiment, in addition to the effects achieved in the first embodiment, it is possible to prevent the protection-target circuit PC from being destroyed by a surge voltage (or an excessive voltage) caused by an ESD, etc. even when the voltage VES becomes a negative voltage with respect to the voltage VSS, similarly to the case where the voltage VES is a positive voltage with respect to the Voltage VSS.

4. Fourth Embodiment

An electrostatic protection circuit of the fourth embodiment is described. The fourth embodiment is a configuration example applicable to the case where a positive or negative voltage VES is input to the input/output terminal TIO. In the fourth embodiment, an example in which two subclamping circuits, which are used in the second embodiment, are provided is explained. The explanation of the fourth embodiment will focus mainly on the points that differ from the second embodiment.

4.1 Configuration of Fourth Embodiment

FIG. 7 is a circuit diagram showing a configuration of the electrostatic protection circuit of the fourth embodiment.

The electrostatic protection circuit 4 includes the main clamping circuit MC, the subclamping circuit SC2, and a subclamping circuit SC2a provided between the ground terminal TVSS and the input/output terminal TIO. Specifically, the subclamping circuit SC2 is provided between the ground terminal TVSS and the first node N1. The subclamping circuit SC2a is provided between the input/output terminal TIO and the first node N1.

The main clamping circuit MC includes the diode D1 and the diode D2. The subclamping circuit SC2 includes the Zener diodes D3, D4, and D5, the resistance element R1, and the MOS transistors T1 and T2. The subclamping circuit SC2a includes Zener the diodes D3a, D4a, and D5a, the resistance element R1a, the MOS transistor T1a, and a MOS field-effect transistor (for example, an n-channel double-diffused metal oxide semiconductor (DMOS) field-effect transistor) T2a.

The Zener diodes D3a, D4a, and D5a in the subclamping circuit SC2a set a voltage supplied to gates of the MOS transistors T1a and T2a to a constant level when a surge voltage caused by an ESD, etc., occurs and turn on the MOS transistors T1a and T2a. The MOS transistors T1a and T2a are turned on upon occurrence of a surge voltage, and let a large current caused by the surge voltage escape to the input/output terminal TIO.

Hereinafter, a relationship of couplings between the circuits shown in FIG. 7 is explained. Similarly to the second embodiment, the diodes D1 and D2 are coupled between the ground wiring 11 and the signal wiring 12. The diodes D1 and D2 are coupled in series in such a manner that their cathodes face each other.

The resistance element R1 and the Zener diodes D3, D4, and D5 are coupled between the ground wiring 11 and the first node N1, similarly to the second embodiment. The resistance element R1 and the Zener diodes D3, D4, and D5 are coupled in series.

The MOS transistors T1 and T2 couple the ground wiring 11 to the first node N1, similarly to the second embodiment. More specifically, the MOS transistors T1 and T2 are coupled in such a manner that the current paths thereof are in series.

The resistance element R1a and the Zener diodes D3a, D4a, and D5a are coupled between the signal wiring 12 and the first node N1. The resistance element R1a and the Zener diodes D3a, D4a, and D5a are coupled in series. In other words, one end of the resistance element R1a is coupled to the signal wiring 12, and the other end of the resistance element R1a is coupled to the anode of the Zener diode D3a. The cathode of the Zener diode D3a is coupled to the anode of the Zener diode D4a, and the cathode of the Zener diode D4a is coupled to the anode of the Zener diode D5a. Furthermore, the cathode of the Zener diode D5a is coupled to the first node N1.

The MOS transistors T1a and T2a couple the signal wiring 12 to the first node N1. More specifically, the MOS transistors T1a and T2a are coupled in such a manner that the current paths thereof are in series. In other words, the source of the MOS transistor T1a is coupled to the signal wiring 12, and the drain of the MOS transistor T1a is coupled to the source of the MOS transistor T2a. The drain of the MOS transistor T2a is coupled to the first node N1. The gates of the MOS transistors T1a and T2a are coupled to the third node N2a.

In the present embodiment, the serially coupled, three-stage Zener diodes are provided between the ground wiring 11 and the first node N1 and between the signal wiring 12 and the first node N1, respectively; however, the embodiment is not limited to this example. The number of stages of the Zener diodes provided between the ground wiring 11 and the first node N1 and between the signal wiring 12 and the first node N1 can be discretionarily set.

4.2. Operation of Fourth Embodiment

An operation of the electrostatic protection circuit 4 of the fourth embodiment is described hereinafter.

Figure 8:
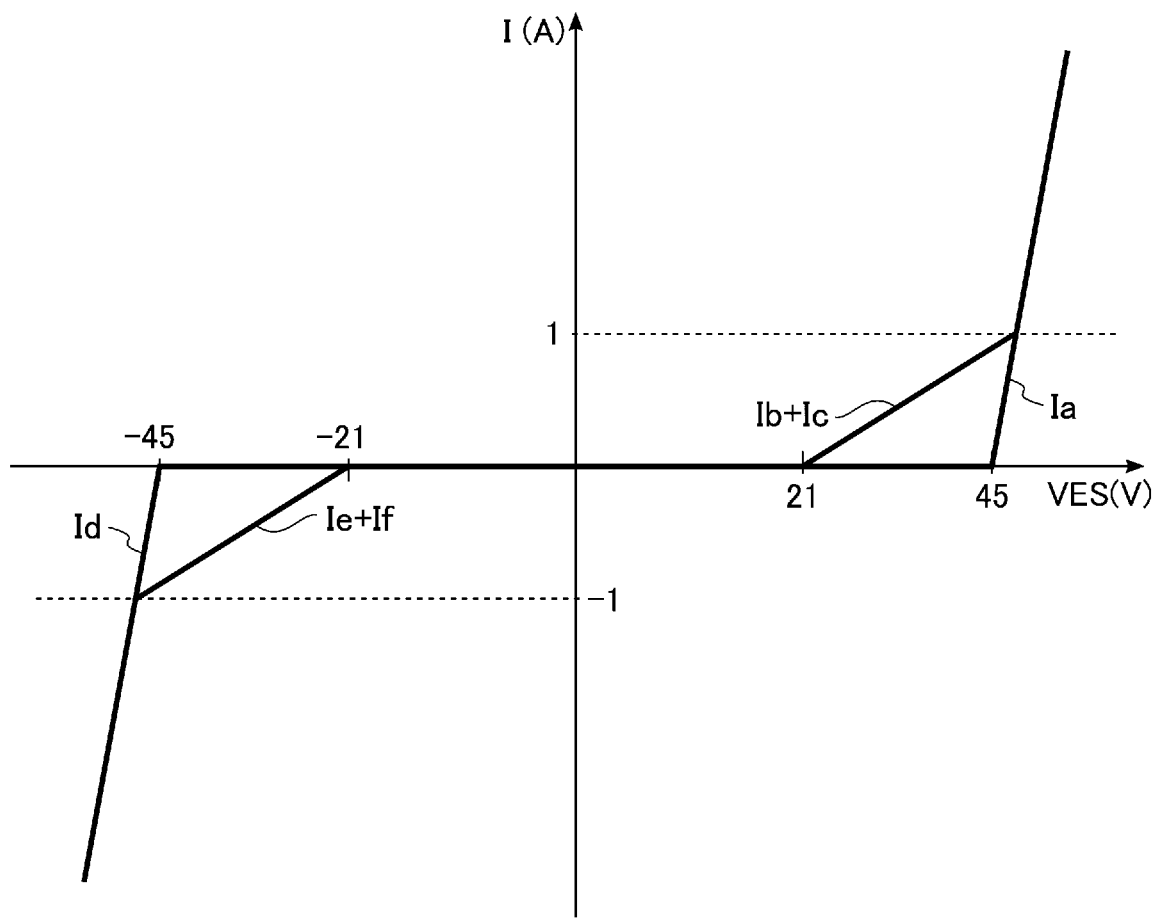
FIG. 8 is a diagram showing current-voltage characteristics of the electrostatic protection circuit according to the fourth embodiment.

FIG. 8 is a diagram showing current-voltage characteristics of the electrostatic protection circuit according to the fourth embodiment. The horizontal axis represents a voltage VES that is input to the input/output terminal TIO, and the vertical axis represents a current that flows in the main clamping circuit MC and the subclamping circuits SC2 and SC2a. Suppose the current flowing in the main clamping circuit MC is Ia or Id, the current flowing in the resistance element R1 of the subclamping circuit SC2 is Ib, and the current flowing in a current path of each of the MOS transistors T1 and T2 is Ic. Suppose the current flowing in the resistance element R1a of the subclamping circuit SC2a is Ie, and the current flowing in a current path of each of the MOS transistors T1a and T2a is If. Herein, as an example, a withstand voltage of each of the diodes D1 and D2 is 45 V, a breakdown voltage of each of the serially coupled, three-stage Zener diodes D3, D4, and D5 and three-stage Zener diodes D3a, D4a, and D5a is 21 V. The case where the MOS transistors T1 and T2 have the same "on" resistance and the MOS transistors T1a and T2a have the same "on" resistance is described.

First, if the voltage VES that is input to the input/output terminal TIO is a positive voltage, the operation is as described below. As shown in FIG. 8, until the voltage VES that is input to the input/output terminal TIO reaches 21 V, no current flows in the main clamping circuit MC and the subclamping circuits SC2 and SC2a.

Next, when the voltage VES exceeds 21 V, the current (Ib+Ic) starts flowing in the subclamping circuit SC2, and the current (Ib+Ic) increases as the voltage VES increases. Herein, the "on" resistance of the MOS transistors T1 and T2 are twice the "on" resistance of the MOS transistor T1 in the first embodiment. For this reason, an amount of current of the current (Ib+Ic) in the fourth embodiment becomes about ½ of an amount of current of the current (Ib+Ic) in the first embodiment. Even in this case, however, there are no problems, because an amount of current necessary for protecting a protection-target circuit PC can be maintained.

Next, when the voltage VES exceeds 45 V, the current Ia starts flowing in the main clamping circuit MC. Thereafter, the current (Ia+Ib+Ic) increases to the order of 1A or larger, for example.

If the voltage VES that is input to the input/output terminal TIO is a negative voltage, on the other hand, the operation is as described below. Until the voltage VES that is input to the input/output terminal TIO falls to −21 V, no current flows in the main clamping circuit MC and the subclamping circuits SC2 and SC2a.

Next, when the voltage VES falls below −21 V, the current (Ie+If) starts flowing in the subclamping circuit SC2a, and the current (Ie+If) increases as the voltage VES falls. Herein, the "on" resistance of the MOS transistors T1a and T2a is twice the "on" resistance of the MOS transistor T1a in the third embodiment. For this reason, an amount of the current (Ie+If) in the fourth embodiment becomes about ½ of an amount of current of the current (Ie+If) in the third embodiment. Even in this case, however, there are no problems, because an amount of current necessary for protecting a protection-target circuit PC can be maintained.

Next, when the voltage VES falls below −45 V, the current Id starts flowing in the main clamping circuit MC. Thereafter, the current (Id+Ie+If) increases to the order of −1A or larger, for example.

In the electrostatic protection circuit 4 of the fourth embodiment, a large current caused by the voltage VES is allowed to quickly escape to the ground terminal TVSS by the current (Ib+Ic) of the subclamping circuit SC2, when the voltage VES exceeds 21 V. A large current caused by the voltage VES is allowed to quickly escape to the input/output terminal TIO by the current (Ie+If) of the subclamping circuit SC2a, when the voltage VES falls below −21 V. It is thereby possible to prevent an excessive current flowing in the protection-target circuit PC. As a result, it is possible to prevent the protection-target circuit PC from being destroyed by a surge voltage caused by an ESD, etc.

4.3 Effects of Fourth Embodiment

According to the fourth embodiment, an electrostatic protection circuit that can improve protective performance can be provided.

With the configuration of the fourth embodiment, in addition to the effects achieved in the second embodiment, it is possible to prevent the protection-target circuit PC from being destroyed by a surge voltage (or an excessive voltage) caused by an ESD, etc. even when the voltage VES becomes a negative voltage with respect to the voltage VSS, similarly to the case where the voltage VES is a positive voltage with respect to the voltage VSS.

5. Others

The foregoing electrostatic protection circuits 1 to 4 are used in an interface circuit of a vehicle-mounted electronic device in which a local interconnect network (LIN) or controller area network (CAN) is adopted, and used other electronic devices, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electrostatic protection circuit comprising:
a first diode coupled to a first wiring;
a second diode coupled between the first diode and a second wiring;
a third diode coupled between the first wiring and a first node at which the first diode and the second diode are coupled to each other;
a first resistance element coupled between the third diode and the first wiring;
a first MOS field-effect transistor coupled between the first node and the first wiring, a gate of the first MOS field-effect transistor being electrically coupled to a second node at which the first resistance element and the third diode are coupled to each other; and
a second MOS field-effect transistor coupled between the first node and the first MOS field-effect transistor, a gate of the second MOS field-effect transistor being electrically coupled to the second node, a first end of the second MOS field-effect transistor being coupled to a second end of the first MOS field-effect transistor, a second end of the second MOS field-effect transistor being electrically coupled to the first node.

2. The electrostatic protection circuit according to claim 1, wherein an anode of the first diode is electrically coupled to the first wiring, a cathode of the first diode is electrically coupled to a cathode of the second diode, and an anode of the second diode is electrically coupled to the second wiring.

3. The electrostatic protection circuit according to claim 1, wherein a first end of the first resistance element is electrically coupled to the first wiring, a second end of the first resistance element is electrically coupled to an anode of the third diode, and a cathode of the third diode is electrically coupled to the first node.

4. The electrostatic protection circuit according to claim 1, further comprising a fourth diode coupled between a cathode of the third diode and the first node, an anode of the fourth diode being electrically coupled to a cathode of the third diode, a cathode of the fourth diode being electrically coupled to the first node.

5. The electrostatic protection circuit according to claim 1, wherein a first end of the first MOS field-effect transistor is electrically coupled to the first wiring.

6. The electrostatic protection circuit according to claim 1, wherein the third diode includes a Zener diode.

7. The electrostatic protection circuit according to claim 1, wherein the first MOS field-effect transistor includes a double-diffused MOS field-effect transistor.

8. An electrostatic protection circuit comprising:
a first diode coupled to a first wiring;
a second diode coupled between the first diode and a second wiring;
a third diode coupled between the first wiring and a first node at which the first diode and the second diode are coupled to each other;
a first resistance element coupled between the third diode and the first wiring;
a first MOS field-effect transistor coupled between the first node and the first wiring, a gate of the first MOS field-effect transistor being electrically coupled to a second node at which the first resistance element and the third diode are coupled to each other;
a fifth diode coupled between the second wiring and the first node at which the first diode and the second diode are coupled to each other;
a second resistance element coupled between the fifth diode and the second wiring; and
a third MOS field-effect transistor coupled between the first node and the second wiring, a gate of the third MOS field-effect transistor being electrically coupled to a third node at which the second resistance element and the fifth diode are coupled to each other, a first end of the third MOS field-effect transistor being electrically coupled to the second wiring.

9. The electrostatic protection circuit according to claim 8, further comprising a sixth diode coupled between a cathode of the fifth diode and the first node, an anode of the sixth diode being electrically coupled to the cathode of the fifth diode, a cathode of the sixth diode being electrically coupled to the first node.

10. The electrostatic protection circuit according to claim 8, further comprising:
a fourth MOS field-effect transistor coupled between the first node and the first MOS field-effect transistor, a gate of the fourth MOS field-effect transistor being electrically coupled to the second node, a first end of the fourth MOS field-effect transistor being electrically coupled to a second end of the first MOS field-effect transistor, a second end of the fourth MOS field-effect transistor being electrically coupled to the first node; and
a fifth MOS field-effect transistor coupled between the first node and the third MOS field-effect transistor, a gate of the fifth MOS field-effect transistor being electrically coupled to the third node, a first end of the fifth MOS field-effect transistor being electrically coupled to a second end of the third MOS field-effect transistor, second end of the fifth MOS field-effect transistor being electrically coupled to the first node.

11. An electrostatic protection circuit comprising:
a first clamping circuit coupled between a first wiring and a second wiring and including a first diode and a second diode, wherein
the first diode and the second diode are coupled in series between the first wiring and the second wiring, and
a cathode of the first diode is electrically coupled to a cathode of the second diode;
a second clamping circuit coupled between a first node that is between the first diode and the second diode and the first wiring, and including a third diode, a first resistance element, and a first MOS field-effect transistor, wherein
a first end of the first resistance element is electrically coupled to the first wiring,
a second end of the first resistance element is electrically coupled to an anode of the third diode,
a cathode of the third diode is electrically coupled to the first node,
a gate of the first MOS field-effect transistor is electrically coupled to a second node at which the second end of the first resistance element and the anode of the third diode are coupled to each other, and
a first end of the first MOS field-effect transistor is electrically coupled to the first wiring; and
a second MOS field-effect transistor coupled between the first node and the first MOS field-effect transistor, a gate of the second MOS field-effect transistor being electrically coupled to the second node, a first end of the second MOS field-effect transistor being electrically coupled to a second end of the first MOS field-effect transistor, a second end of the second MOS field-effect transistor being electrically coupled to the first node.

12. The electrostatic protection circuit according to claim 11, wherein an anode of the first diode is electrically coupled to the first wiring, a cathode of the first diode is electrically coupled to a cathode of the second diode, and an anode of the second diode is electrically coupled to the second wiring.

13. The electrostatic protection circuit according to claim 11, further comprising a fourth diode coupled between a cathode of the third diode and the first node, an anode of the fourth diode being electrically coupled to the cathode of the third diode, a cathode of the fourth diode being electrically coupled to the first node.

14. The electrostatic protection circuit according to claim 11, wherein the third diode includes a Zener diode.

15. The electrostatic protection circuit according to claim 11, wherein the first MOS field-effect transistor includes a double-diffused MOS field-effect transistor.

16. An electrostatic protection circuit comprising:
a first clamping circuit coupled between a first wiring and a second wiring and including a first diode and a second diode, wherein
the first diode and the second diode are coupled in series between the first wiring and the second wiring, and
a cathode of the first diode is electrically coupled to a cathode of the second diode;
a second clamping circuit coupled between a first node that is between the first diode and the second diode and the first wiring, and including a third diode, a first resistance element, and a first MOS field-effect transistor, wherein
a first end of the first resistance element is electrically coupled to the first wiring,
a second end of the first resistance element is electrically coupled to an anode of the third diode,
a cathode of the third diode is electrically coupled to the first node,
a gate of the first MOS field-effect transistor is electrically coupled to the anode of the third diode,
a first end of the first MOS field-effect transistor is electrically coupled to the first wiring, and
a second end of the first MOS field-effect transistor is electrically connected to the first node;

a third clamping circuit coupled between the first node that is between the first diode and the second diode and the second wiring, and including a fifth diode, a second resistance element, and a third MOS field-effect transistor, wherein a first end of the second resistance element is electrically coupled to the second wiring, a second end of the second resistance element is electrically coupled to an anode of the fifth diode, a cathode of the fifth diode is electrically coupled to the first node, a gate of the third MOS field-effect transistor is electrically coupled to the anode of the fifth diode, a first end of the third MOS field-effect transistor is electrically coupled to the second wiring, and a second end of the third MOS field-effect transistor is electrically connected to the first node.

17. The electrostatic protection circuit according to claim 16, further comprising a sixth diode coupled between the cathode of the fifth diode and the first node, an anode of the sixth diode being electrically coupled to a cathode of the fifth diode, a cathode of the sixth diode being electrically coupled to the first node.

18. The electrostatic protection circuit according to claim 16, further comprising:

a fourth MOS field-effect transistor coupled between the first node and the first MOS field-effect transistor, a gate of the fourth MOS field-effect transistor being electrically coupled to the anode of the third diode, a first end of the fourth MOS field-effect transistor being electrically coupled to the second end of the first MOS field-effect transistor, a second end of the fourth MOS field-effect transistor being electrically coupled to the first node; and a fifth MOS field-effect transistor coupled between the first node and the third MOS field-effect transistor, a gate of the fifth MOS field-effect transistor being electrically coupled to the anode of the fifth diode, a first end of the fifth MOS field-effect transistor being electrically coupled to the second end of the third MOS field-effect transistor, a second end of the fifth MOS field-effect transistor being electrically coupled to the first node.

* * * * *